United States Patent
Sogabe et al.

(10) Patent No.: US 9,926,236 B2
(45) Date of Patent: Mar. 27, 2018

(54) OXIDE SINTERED BODY, PROCESS FOR MANUFACTURING SAME, AND OXIDE FILM

(71) Applicant: SUMITOMO METAL MINING CO., LTD., Tokyo (JP)

(72) Inventors: Kentaro Sogabe, Tokyo (JP); Isao Ando, Tokyo (JP); Makoto Ozawa, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 15/125,044

(22) PCT Filed: Jan. 30, 2015

(86) PCT No.: PCT/JP2015/052631
§ 371 (c)(1),
(2) Date: Sep. 9, 2016

(87) PCT Pub. No.: WO2015/182167
PCT Pub. Date: Dec. 3, 2015

(65) Prior Publication Data
US 2017/0015589 A1 Jan. 19, 2017

(30) Foreign Application Priority Data

May 30, 2014 (JP) ................. 2014-113139

(51) Int. Cl.
| C04B 35/16 | (2006.01) |
| C23C 14/08 | (2006.01) |
| C23C 14/34 | (2006.01) |
| C04B 35/01 | (2006.01) |
| C04B 35/626 | (2006.01) |

(52) U.S. Cl.
CPC ............ *C04B 35/16* (2013.01); *C04B 35/01* (2013.01); *C04B 35/6261* (2013.01); *C23C 14/08* (2013.01); *C23C 14/3414* (2013.01); *C04B 2235/3232* (2013.01); *C04B 2235/3286* (2013.01); *C04B 2235/3293* (2013.01); *C04B 2235/5445* (2013.01); *C04B 2235/656* (2013.01); *C04B 2235/728* (2013.01); *C04B 2235/77* (2013.01); *C04B 2235/80* (2013.01); *C04B 2235/95* (2013.01); *C04B 2235/96* (2013.01); *C04B 2235/9623* (2013.01)

(58) Field of Classification Search
CPC ..... C01G 15/00; C01G 15/003; C01G 15/006
See application file for complete search history.

(56) References Cited

U.S. PATENT DOCUMENTS 8,268,141 B2 * 9/2012 Zhang ................. C04B 35/119
204/298.13

FOREIGN PATENT DOCUMENTS

| JP | 2007-055841 A | 3/2007 | |
| JP | 2007-176706 A | 7/2007 | |
| JP | 4028269 B2 | 12/2007 | |
| JP | 4424889 B2 | 3/2010 | |
| JP | 4915065 B2 | 4/2012 | |
| JP | 2013-144821 A | 7/2013 | |
| JP | 2013144821 A * | 7/2013 | ............ C23C 14/34 |
| JP | 2015-003846 A | 1/2015 | |
| WO | 2007/142333 A1 | 12/2007 | |

OTHER PUBLICATIONS

Kazutaka Makino, "Color-Ban Kobustu Shigen Hyakka Jiten", p. 491, 1999.
Apr. 21, 2015 International Search Report issued in International Patent Application No. PCT/JP2015/052631.

* cited by examiner

*Primary Examiner* — Noah S Wiese
(74) *Attorney, Agent, or Firm* — Oliff PLC

(57) ABSTRACT

The present invention provides: an oxide sintered body having superior manufacturing stability, film stability, discharge stability, and mechanical strength; a process for manufacturing the same; and an oxide film obtained by using the oxide sintered body and having an intermediate refractive index. The oxide sintered body comprising In and Si, wherein a Si content is 0.65 to 1.75 in Si/In atomic ratio, a relative density is 90% or more, and a bending strength is 90 N/mm² or more, is manufactured, and the oxide film with refractive index of 1.70 to 1.90 by a sputtering process using the oxide sintered body is manufactured.

11 Claims, No Drawings

OXIDE SINTERED BODY, PROCESS FOR MANUFACTURING SAME, AND OXIDE FILM

BACKGROUND OF THE INVENTION

Field of the Invention

The present invention relates to an oxide sintered body and a process for manufacturing the oxide sintered body composed of an oxide mainly comprising indium and silicon, and also, to an oxide film obtained by using the oxide sintered body. In addition, the present application claims priority based on the Japanese Patent Application No. 2014-113139 filed on May 30, 2014 in Japan.

Description of Related Art

The oxide film has been used in various ways such as electrode of various light reception elements, i.e. solar battery, liquid crystal display element, and else, or various antifogging transparent heating elements, i.e. heat-ray reflective film for cars or construction, antistatic film, freezing show case, and else. Also, it is applied as optical film represented by antireflective film, reflection increasing film, interference film, polarizing film, and else. As the optical film, it is applied as a laminated body combining the oxide films having various features.

A spectral characteristic of oxide multi-layered film is decided by film thickness "d" and refractive index "n" of each layer, when extinction coefficient k can be regarded as almost zero. Therefore, in optical design of the laminated body using oxide film, it is generally carried out by a calculation based on data of "d" and "n" of each layer configuring the oxide multi-layered film. In this case, in addition to combining high refractive index film and low refractive index film, also by adding a film having intermediate refractive index of these films (intermediate refractive index film), a multi-layered film having superior optical characteristic can be obtained.

As general high refractive index film (n>1.90), $TiO_2$ (n=2.4), $CeO_2$ (n=2.3), $ZrO_2$ (n=2.2), $Nb_2O_5$ (n=2.1), $Ta_2O_5$ (n=2.1), $WO_3$ (n=2.0) and else are known. As low refractive index film (n<1.60), $SiO_2$ (n=1.4), $MgF_2$ (n=1.4) and else are known. As intermediate refractive index film (n=1.60 to 1.90), $Al_2O_3$ (n=1.6), MgO (n=1.7), $Y_2O_3$ (n=1.8) and else are known.

As a process for forming these oxide films, sputtering process, vapor deposition process, ion plating process, solution coating process and else are generally known. Among those, the sputtering process is widely used in industry, as the operation is very easy, and as it is useful when film formation of material with low vapor pressure or precise control of film thickness is required.

In concrete sputtering process, a target is used as raw material of various oxide films. This process generates argon plasma by causing glow discharge between an anode and a cathode, generally under gas pressure of about 10 Pa or less, with substrate as the anode and with target as the cathode. And it forms a film by colliding argon positive ion in the plasma to the target of the cathode, and by depositing particles of target component ejected by the collision on the substrate.

The sputtering process is classified by the generation process of argon plasma, and the process using radio frequency plasma is called radio frequency sputtering process and the process using direct current plasma is called direct current sputtering process. Generally, the direct current sputtering process is used widely in the industry for the reasons such that a deposition rate is faster compared to the radio frequency sputtering process, and that power source facility is inexpensive, and that an operation of film formation is easy. For example, in manufacturing of transparent conductive thin film, direct current magnetron sputtering process is widely adopted.

However, generally, in the sputtering process, when a raw material of the target is insulating target, it is necessary to use radio frequency sputtering process, and it will be impossible to obtain high deposition rate with this process.

On the other hand, the general intermediate refractive index materials, such as the above $Al_2O_3$, MgO, $Y_2O_3$ and else, are all poor in conductivity, and it is not possible to achieve the stable discharge when used for sputtering target as it is. Therefore, it is necessary to perform sputtering (reactive sputtering process) while reacting metal particles and oxygen in an atmosphere including a lot of oxygen by using metal target having conductivity, in order to obtain the intermediate refractive index film by the sputtering process.

However, in the reactive sputtering process including a lot of oxygen, its deposition rate is extremely slow, so the productivity will be impaired significantly. As a result, there are industrial problems such that a unit cost of the obtained intermediate refractive index film will be expensive, and else.

Here, as a material for obtaining the intermediate refractive index film, In—Si—O based oxide sintered body is proposed (For example, refer to D1.). Normally, In—Si—O based oxide sintered body comprising high concentration Si is poor in sinterability. From this point, in the technology described in D1, a sintered body is obtained from indium oxide powder and Si powder as raw materials, and also, by using hot press process, in order to solve these problems.

Patent Document 1: JP 4915065 B
Patent Document 2: JP 4424889 B
Patent Document 3: JP 2007-176706 A
Patent Document 4: JP 4028269 B

SUMMARY OF THE INVENTION

However, by the process described in D1, a high density sintered body having a relative density equal to or more than 90% can be obtained depending on the condition, but it is using Si powder, which is a non-oxide, as a raw material, so as a result, metal Si phase remains in a sintered body. Therefore, when forming film by sputtering with this sintered body as a target, an oxidation reaction of Si occurs at a target surface by oxygen included in a chamber, and as extremely high combustion heat occurs, a target surface condition will be significantly rough, and there is a case that the film formation cannot be continued.

As the other process for obtaining In—Si—O based oxide sintered body with high conductivity, an indium oxide based low resistance target added with Si and Sn is proposed (For example, refer to D2.). However, it cannot be said that the composition of this target is an intermediate refractive index composition as Si content is low as 0.26 or less in Si/In atomic ratio.

Also, in D3, an indium oxide based low resistance target added with Si and Sn is proposed. However, also in this target, Si content is low as well as the target described in D2. Therefore, the problem to increase the strength and the density of the oxide sintered body necessary for the target comprising high concentration Si remains unsolved, so cracking and chipping occurs when manufacturing, so it is difficult to achieve a stable discharge in a sputtering.

Further, regarding the sintered body comprising high concentration Si, in D4, the composition added with $SnO_2$ and $TiO_2$ is proposed. This process is specialized in decreasing the resistance of $In_2O_3$ based sintered body, and when $SiO_2$ is high concentration as 7 wt % to 40 wt %, it is necessary to add $SnO_2$ until $SnO_2/(In_2O_3+SnO_2)=0.10$. However, in addition to the amount of $SnO_2$, when the amount of $TiO_2$, the refractive index of which is 2.0 or more, is high, the refractive index will be high, so it is not possible to obtain the intermediate refractive index film useful as the oxide film.

As explained in the above, in the indium oxide based material comprising high concentration Si, there is no high density and high strength sputtering target capable of prohibiting cracking and chipping in the manufacturing, and also, capable of achieving the stable film formation using sputtering process.

Here, the present invention is invented considering the above actual circumstances, and, in In—Si—O based oxide sintered body, the present invention aims to provide an oxide sintered body, which can be obtained without cracking and chipping, and superior in film stability and discharge stability even comprising a lot of Si, which was impossible by the prior art, and its manufacturing process, and also, to provide the oxide film of intermediate refractive index obtained by using its oxide sintered body.

In order to achieve the above purpose, an oxide sintered body relating to the present invention comprises In and Si, wherein Si content is 0.65 to 1.75 in Si/In atomic ratio, and a relative density calculated by actual measured value of density of the oxide sintered body with respect to a density calculated from true density and abundance ratio of each compound phase composing the oxide sintered body is 90% or more, and a bending strength is 90 $N/mm^2$ or more.

Here, in the oxide sintered body relating to the present invention, it is preferable that a proportion of crystalline phase of thortveitite-type indium silicate compound is 30 mass % or less.

Also, it is preferable that the oxide sintered body relating to the present invention does not comprise metal Si phase. Also, in the oxide sintered body relating to the present invention, it is preferable that the metal Si phase will not be detected by a X-ray diffraction method of powder of the oxide sintered body and/or an electron ray diffraction method of lamina of the oxide sintered body.

Also, it is preferable that the oxide sintered body relating to the present invention does not comprise crystalline silicon dioxide compound phase. Also, in the oxide sintered body relating to the present invention, it is preferable that the crystalline silicon dioxide compound phase will not be detected by a X-ray diffraction method of powder of the oxide sintered body and/or an electron ray diffraction method of lamina of the oxide sintered body.

Also, the oxide sintered body relating to the present invention further comprises at least one kind of metal element selected from trivalent or higher-valent metal element other than In and Si, and in the case that M is whole component of the comprised metal element, the M content may be 0.001 to 0.05 in M/In atomic ratio.

Also, a manufacturing process of an oxide sintered body relating to the present invention is the manufacturing process of the above oxide sintered body, wherein non-crystalline silicon dioxide powder is used as raw material of Si, and a formed body including the non-crystalline silicon dioxide powder is sintered by normal pressure sintering process.

Also, in the manufacturing process of the oxide sintered body relating to the present invention, it is preferable that the formed body is sintered at 1100° C. to 1400° C.

Also, an oxide film relating to the present invention is the oxide film obtained by sputtering process using the oxide sintered body as a sputtering target, wherein refractive index is 1.70 to 1.90.

According to the present invention, it is possible to manufacture the oxide sintered body capable of stable film formation without occurring abnormal discharge by the sputtering process, as cracking and chipping during film formation and at the time of manufacturing is prohibited, as it is superior in mechanical strength. Thereby, it is possible to use the obtained oxide sintered body to a sputtering target for forming the oxide film.

Also, according to the present invention, it is possible to provide and stably form an optically useful intermediate refractive index film by sputtering using the oxide sintered body as the sputtering target.

DETAILED DESCRIPTION OF THE INVENTION

It will be explained in detail about the concrete embodiments applying the present invention (Hereinafter, referred to as "present embodiment") in the following order. In addition, the present invention will not be limited by the following embodiments, and these embodiments can be modified in various ways without departing from the gist of the present invention.

1. Oxide Sintered Body
2. Manufacturing Process of Oxide Sintered Body
3. Oxide Film
4. Examples

1. OXIDE SINTERED BODY

At first, explaining about an oxide sintered body relating to the present embodiment.

The oxide sintered body is for obtaining an oxide film having desired refractive index, and comprising indium (In) and silicon (Si).

The herein described "oxide film having desired refractive index" means an intermediate refractive index film. The intermediate refractive index film is a film having intermediate refractive index between a film having high refractive index (Hereinafter, referred to as "high refractive index film".) and a film having low refractive index (Hereinafter, referred to as "low refractive index film".).

Generally, the high refractive index film is a film with refractive index "n" of over 1.90 (n>1.90), and the low refractive index film is a film with refractive index "n" of below 1.60 (n<1.60), and the intermediate refractive index film is a film with refractive index "n" of 1.60 to 1.90 (n=1.60 to 1.90).

The oxide sintered body is for obtaining the intermediate refractive index film, but herein described intermediate refractive index film is especially an oxide film with refractive index of 1.70 to 1.90.

When forming the oxide film with refractive index of 1.70 to 1.90 by using such oxide sintered body as the sputtering target, it is understood that the refractive index of the oxide film depends on the composition of the oxide sintered body.

Here, in the oxide sintered body, silicon dioxide is added with indium oxide as main component, and its Si content is adjusted to 0.65 to 1.75 in Si/In atomic ratio. As such, it is possible to prevent damage of the oxide sintered body by including Si in the oxide sintered body.

If Si/In atomic ratio is less than 0.65, the oxide film obtained by using the oxide sintered body will be having high refractive index, on the other hand, if Si/In atomic ratio is more than 1.75, the oxide film obtained by using the oxide sintered body will be having low refractive index, so it is not possible to obtain the oxide film with intermediate refractive index of 1.70 to 1.90. Therefore, in the oxide sintered body, Si content is 0.65 to 1.75 in Si/In atomic ratio, in order to obtain the oxide film with refractive index of 1.70 to 1.90.

In the oxide sintered body, when Si content is over about 0.6 mol with respect to 1 mol of In content, the sinterability of the oxide sintered body decreases significantly. Therefore, especially when crystalline silicon dioxide is used as a starting material of the oxide sintered body, it will be extremely difficult to sinter at normal atmospheric pressure, from lowness of sinterability.

Here, in the oxide sintered body, it is possible to obtain the oxide sintered body having a relative density equal to or more than 90%, and having more superior mechanical strength (bending strength) by using non-crystalline silicon dioxide powder as raw material of Si.

When calculating the relative density of the oxide sintered body, true density differs largely by the compound existing in the oxide sintered body, so a definition of the true density will be important. In other words, in the oxide sintered body, it is necessary to calculate the relative density with respect to the density calculated from the true density and abundance ratio of each compound phase composing the oxide sintered body.

For example, in indium oxide based sintered body including silicon dioxide in a ratio of 30 mass %, when indium oxide (density 7.18 g/cm$^3$) and non-crystalline silicon dioxide (density 2.2 g/cm$^3$) respectively exist separately, its true density is calculated with 4.28 g/cm$^3$. However, when indium silicate compound phase is generated in indium oxide based sintered body, this true density is calculated as 5.05 g/cm$^3$, so there will be large difference from original relative density, unless the true density also considering the abundance ratio of indium silicate compound phase is adopted. Thereby, in the oxide sintered body, it is adopting the relative density with respect to the density calculated from the true density and the abundance ratio of each compound phase.

In other words, the herein described relative density can be indicated by $(B/A)*100[\%]$, which is a proportion (percentage) of an actual measured value (B) of the density of the oxide sintered body with respect to a density (A) calculated considering the abundance ratio of each compound phase to the true density of indium silicate phase, silicon dioxide phase, and indium oxide phase, i.e. each compound phase included in the oxide sintered body. In addition, the density of the oxide sintered body can be measured for example by using Archimedes method.

The relative density of the oxide sintered body largely affects not only a securing of high yield at the time of manufacturing, but also a discharge stability of the oxide sintered body at the sputtering. Here, by making the relative density equal to or more than 90%, it is possible to decrease particles (micro-particles) or nodules (protrusion) generated at the time of sputtering discharge, and also, it is possible to effectively prohibit the occurrence of arcing (abnormal discharge) impeding the continuous discharge. As the above, the oxide sintered body can stabilize the sputtering discharge, so it is possible to improve the quality and the uniformity of the obtained oxide film.

By the way, when forming the oxide film using the oxide sintered body as the sputtering target, about the stabilization of discharge at the sputtering, it is understood that it depends not only on the density of the oxide sintered body but also on the compound phase composing the oxide sintered body.

The oxide sintered body includes the crystalline phase of the thortveitite-type indium silicate compound in the ratio of 30 mass % or less, and when the content ratio of this crystalline phase exceeds 30 mass %, it will lead to the decrease of strength from the change of crystalline structure.

Here, the thortveitite-type indium silicate is a compound described in literature (Journal of Solid State Chemistry 2, 199-202 (1970)) and JCPDS card (31-600). In the oxide sintered body, even if the composition deviation from stoichiometric composition is occurring a little, or even if a part within the indium silicate compound is replaced by the other ion, it is fine so long as this crystalline structure is maintained.

In the oxide sintered body, there is no existence of precipitated phase of Si (Hereinafter, referred to as simply "Si phase".) and/or silicon dioxide compound phase. In other words, in the oxide sintered body, Si phase (metal Si phase) and/or silicon dioxide compound phase will not be detected, for example by formation phase measurement by X-ray diffraction using CuK $\alpha$ ray with respect to the powder of the oxide sintered body obtained by pulverization, or by formation phase measurement by electron ray diffraction with respect to the lamina of the oxide sintered body obtained by working with Focused Ion Beam (FIB).

By configuring the oxide sintered body without Si phase, when the oxide sintered body is used as the sputtering target, it is possible to perform sputtering without causing significant roughness of the target surface, which was impossible for the prior art process. The reason for this can be explained as follows.

In a mechanism of film formation in general sputtering, argon ions in plasma collide with target surface and eject the particles of target component to be deposited on the substrate.

When the film is formed with the oxide sintered body with Si phase as the sputtering target, oxygen supplied from the oxide sintered body or oxygen supplied when oxygen containing argon gas is introduced and Si in the oxide sintered body cause oxidization reaction by plasma heat. It is understood that this oxidation reaction generates extremely high oxidation combustion heat as 930 kJ/mol, and causes significant roughness to the target surface by local heat.

Especially, when the sintering-resistant crystalline silicon dioxide compound phase exists in the oxide sintered body, it causes significant roughness to the target surface, as abnormal discharge occurs frequently even when the density of the oxide sintered body is significantly low.

On the other hand, when the film is formed by using the oxide sintered body of increased density with the relative density equal to or more than 90%, and also, without Si phase and/or crystalline silicon dioxide compound phase, as the target, the stable discharge becomes possible as it is possible to avoid abnormal circumstances such as significant roughness of target surface or arcing.

The bending strength of the oxide sintered body is 90 N/mm$^2$ or more. The oxide sintered body having such bending strength could prevent cracking and chipping at the time of discharge in the sputtering or cracking of target at the time of manufacturing.

When the bending strength is less than 90 N/mm$^2$, the cracking of the target occurs at the time of manufacturing, and it causes the deterioration of yield. Also, cracking and chipping tend to occur at the time of discharge in the sputtering.

The bending strength of the oxide sintered body is measured by performing three-point bending test by the process basically according to JIS R1601. In other words, the oxide sintered body is worked into stick shape of length 40 mm*width 4 mm*thickness 3 mm to be a test piece, and a metal jig is pushed onto the test piece at the speed of 0.5 mm/min, and the load applied when the test piece breaks is measured to calculate the bending strength. And, two oxide sintered bodies manufactured by the same condition are provided to the strength test, and a mean value thereof will be the bending strength.

In the oxide sintered body, at least one kind of metal element selected from trivalent or higher-valent metal element may be included as the metal element (third component) other than In and Si. By the addition of the metal element, it is possible to improve the mechanical strength and the density of the oxide sintered body. However, with univalent or bivalent metal element, the increase of resistance of the oxide sintered body could be considered, so in the oxide sintered body, the trivalent or higher-valent metal element other than In or Si is used. As such metal element, for example, Ti (titanium), Sn (tin), Y (yttrium), Ga (gallium), Ta (tantalum), Al (aluminum) and else can be cited.

When the whole component of the metal element other than In or Si is M, the content of trivalent or higher-valent metal element other than In and Si is 0.001 to 0.05 in M/In atomic ratio. If M/In atomic ratio is less than 0.001, the effect to decrease the resistance cannot be achieved sufficiently, on the other hands, if M/In atomic ratio is more than 0.05, it is not preferable as the refractive index may be increased. Therefore, it is preferable that the content of the trivalent or higher-valent metal element other than In and Si is 0.001 to 0.05 in M/In atomic ratio.

As mentioned above, the oxide sintered body comprises In and Si, and it is characterized in that the Si content is 0.65 to 1.75 in Si/In atomic ratio, and that the relative density is 90% or more, and that the bending strength is 90 N/mm$^2$ or more.

In the sputtering target for forming the oxide film using such oxide sintered body, the relative density is 90% or more, and the bending strength is 90 N/mm$^2$ or more, so it is superior in the mechanical strength, and there is no cracking and chipping during the film formation and at the time of manufacturing, and the particles and nodules will be decreased, and also, the abnormal circumstances such as significant roughness of target surface and arcing can be avoided, so the stable discharge becomes possible continuously Also, when the sputtering is performed by using the sputtering target for forming oxide film, it is possible to stably obtain the oxide film with the refractive index of 1.70 to 1.90 by the sputtering process, as the Si content in the oxide sintered body is 0.65 to 1.75 in Si/In atomic ratio.

2. MANUFACTURING PROCESS OF OXIDE SINTERED BODY

Next, explaining about a manufacturing process of the oxide sintered body relating to the present embodiment.

The manufacturing process of the oxide sintered body comprises a first step for obtaining granulated powder by mixing raw material powder of components composing the oxide sintered body at the predetermined ratio, a second step for obtaining a formed body by forming the obtained granulated powder, and a third step for obtaining a sintered body by calcining the obtained formed body.

<2-1. First Step (Granulating Step)>

The first step is a granulating step for obtaining the granulated powder by mixing the raw material powder of the components composing the oxide sintered body at the predetermined ratio, and by mixing it with water and various additives to obtain slurry, and by drying the obtained slurry to granulate it.

In the first step, indium oxide powder is used as raw material of In and silicon dioxide powder is used as raw material of Si respectively, and especially, non-crystalline silicon dioxide powder is used as the raw material powder.

Here, if crystalline silicon dioxide powder such as quartz is used as raw material of Si, it will be necessary to raise a calcining temperature to a temperature over 1400° C., from its low sinterability. However, when the calcining temperature is over 1400° C., thortveitite-type indium silicate crystal, which is an intermediate compound phase, will be generated in the ratio over 30 mass %, thereby causing the decrease of strength from the change of crystalline structure.

Here, if non-crystalline silicon dioxide powder is used as raw material of Si, it is possible to obtain the oxide sintered body with almost no holes, and without generating indium silicate compound phase by viscous flow of non-crystalline silicon dioxide, even in low temperature area equal to or less than 1400° C. capable of prohibiting the generation of thortveitite-type indium silicate crystal.

In the first step, non-oxide Si powder (metal Si powder) is not used as raw material of Si, and non-crystalline silicon dioxide powder is used. Thereby, it is possible to manufacture the oxide sintered body stably, and also, it is possible to manufacture the oxide sintered body without Si phase and/or silicon dioxide compound phase.

On the other hand, if Si powder is used as raw material, in a normal pressure sintering at atmospheric air or oxygen atmosphere, there will be a risk of occurring sintering error by the local heat by the oxidization of Si, and stable manufacturing of the oxide sintered body will be extremely difficult. Also, even if the oxide sintered body is obtained, Si phase and/or silicon dioxide compound phase will be remained, so there is a possibility that the significant roughness of the target surface will occur during the film formation at the sputtering. Therefore, in the first step, non-crystalline silicon dioxide powder is used as raw material of Si.

Also, in the first step, the oxide powder including trivalent or higher-valent metal element other than In and Si may be added further, according to need. As such oxide powder, titanium dioxide ($TiO_2$), tin dioxide ($SnO_2$), yttrium oxide (III) ($Y_2O_3$), gallium oxide (III) ($Ga_2O_3$), tantalum oxide (V) ($Ta_2O_5$), aluminum oxide ($Al_2O_3$) and else can be cited.

As median diameter of each raw material powder, it is not limited especially, but if the particle size is too large, the relative density of the oxide sintered body will be decreased, and also, the mechanical strength and the conductivity of the oxide sintered body will be decreased.

In the first step, each raw material powder is mixed by weighing in a proportion that Si will be 0.65 to 1.75 in Si/In atomic ratio. When further adding the oxide powder of trivalent or higher-valent metal element other than In and Si to the above, it is mixed by weighing its content to be 0.001 to 0.05 in M/In atomic ratio, wherein M is whole component of the added oxide powder.

Next, in the first step, each raw material powder weighed a predetermined amount is mixed with pure water, polyvinyl alcohol, organic binder such as acryl based binder and else, and dispersing agent such as acrylate metacrylate copolymer ammonia neutralizer, acrylate based copolymer amine salt and else, and it is mixed to be slurry such that the concentration of the raw material powder will be 50 mass % to 80 mass %, preferably 65 mass %. And, a wet pulverization is performed such that the mixed powder in the slurry will be predetermined median diameter.

The median diameter of the powder obtained by the wet pulverization is not limited especially, but it is preferable that it is pulverized until 1 µm or less. If the median diameter is over 1 µm, not only the relative density of the sintered body decreases, but also a contact area between the particles decreases, so a refinement of the oxide sintered body will be impeded, and as a result, there is a possibility that the oxide sintered body having conductivity, mechanical strength and density sufficient for the stable discharge cannot be obtained.

In the wet pulverization, it is preferable to use a pulverization device, for example beads mill supplied with hard balls (zirconium dioxide ($ZrO_2$) ball and else) having the particle size equal to or less than 2.0 mm. By this device, it is possible to remove the flocculation of each raw material powder surely.

On the other hand, when using the pulverization device such as ball mill supplied with balls having the particle size over 2.0 mm, it will be difficult to pulverize the particles until the particle size equal to or less than 1.0 µm, and as a result, the refinement of the oxide sintered body will be impeded, and the density, mechanical strength and conductivity of the oxide sintered body will be insufficient.

As mentioned above, in the first step, after wet pulverizing the slurry obtained by mixing the raw material powder, the granulated powder is obtained by drying and granulating the slurry obtained, for example by stirring for 30 minutes or more.

<2-2. Second Phase (Forming Step)>

A second step is a forming step for obtaining a formed body by pressure forming the granulated powder obtained by the first step.

In the second step, the pressure forming is performed, for example with the pressure equal to or more than 196 MPa (2.0 ton/$cm^2$), in order to remove the gap between the particles of the granulated powder. It is not limited especially about the process of this pressure forming, but it is preferable to use Cold Isostatic Press (CIP) which is possible to apply high pressure.

However, the device capable of performing the pressure forming over 300 MPa is extremely expensive, so the production cost will be high and it will be extremely inefficient economically.

Therefore, in the second step, it is possible to manufacture the formed body preferably by performing the pressure forming equal to or more than 196 MPa, more preferably by performing the pressure forming of 196 MPa to 300 MPa.

<2-3. Third Step (Calcining Step)>

A third step is a calcining step for obtaining the oxide sintered body by calcining the formed body obtained by the second step at normal pressure.

The calcining treatment in the third step performs sintering preferably at calcining temperature 1100° C. to 1400° C., more preferably at calcining temperature 1250° C. to 1350° C.

When the calcining temperature is below 1100° C., a viscous flow of non-crystalline silicon dioxide will be insufficient, so the desired density of the oxide sintered body cannot be obtained. On the other hand, when the calcining temperature is over 1400° C., crystallization of silicon dioxide or generation of thortveitite-type indium silicate compound phase progresses significantly. As a result, a proportion of indium silicate compound phase will be over 30 mass %, and a bending strength will be below 90 N/$mm^2$.

In the third step, from a point of view of manufacturing the desired oxide sintered body, it is preferable to sinter at calcining temperature 1100° C. to 1400° C.

Also, in the third step, non-crystalline silicon dioxide powder is used as raw material of Si included in the formed body, and the sinterability will be improved by using this formed body. And, the sintering at the normal atmospheric pressure (normal pressure sintering) will be possible, and it is possible to manufacture the oxide sintered body with high density.

As mentioned above, a manufacturing process of the oxide sintered body is capable of obtaining the above mentioned characteristic oxide sintered body without damage, by using non-crystalline silicon dioxide powder as raw material of Si, and further, by using oxide powder of trivalent or higher-valent metal element other than In and Si according to need, and by sintering at calcining temperature 1100° C. to 1400° C. by normal temperature sintering process.

In the manufacturing process of the oxide sintered body, it is possible to prohibit cracking and chipping during film formation and at the time of manufacturing, and it is possible to manufacture the oxide sintered body without damage, which is capable of stable film formation without occurring abnormal discharge by the sputtering process.

With respect to the obtained oxide sintered body, a circumference working and a surface grinding are performed to be the desired target shape, and it is possible to configure the sputtering target by bonding the worked oxide sintered body to a backing plate. The preferable target shape is a plane shape or a cylindrical shape, but it is not limited to these shapes.

The sputtering target formed as such is possible to discharge stably by preventing the occurrence of arcing caused by low density, at the time of sputtering, and it is possible to stably form the oxide film having refractive index of 1.70 to 1.90, which is extremely useful optically.

3. OXIDE FILM

Next, explaining about the oxide film relating to the present embodiment.

The oxide film is formed by forming a film on a substrate by a sputtering process, using the oxide sintered body having the above characteristics as a sputtering target.

As mentioned above, the oxide film is formed with the oxide sintered body comprising In and Si, wherein a Si content is 0.65 to 1.75 in Si/In atomic ratio, and a relative density calculated by actual measured value of density of the oxide sintered body with respect to a density calculated from the true density and abundance ratio of each compound phase composing the oxide sintered body is 90% or more, and a bending strength is 90 N/$mm^2$ or more, as raw material, and the composition of this oxide sintered body will be reflected to the oxide film.

Also, when the oxide powder of trivalent or higher-valent metal element other than In and Si is further added to the oxide sintered body, the oxide film will be formed with the oxide sintered body with M content of 0.001 to 0.05 in M/In atomic ratio, wherein M is whole added metal element, as raw material, and the composition of the oxide sintered body will be reflected to the oxide film. In addition, about the detail of the trivalent or higher-valent metal element other than In and Si, it is as described in the above, so it will not be explained in detail here.

Therefore, the oxide film is composed of the oxide comprising In and Si, and trivalent or higher-valent metal element other than In and Si according to need, and also, it will be an intermediate refractive index film with refractive index of 1.70 to 1.90.

The thickness of the oxide film is not limited especially, and it could be set accordingly by the time of film formation, the type of sputtering process and else, and for example, it could be 5 nm to 300 nm.

When sputtering, its sputtering process is not limited especially, and DC (direct current) sputtering process, pulse DC sputtering process, AC (alternate current) sputtering process, RF (radio frequency) magnetron sputtering process, electron beam vapor deposition process, ion plating process and else can be cited.

As the substrate, it is possible to use, for example glass, resin such as PET (Polyethylene terephthalate) or PES (Polyether sulfone), and else.

A film formation temperature of the oxide film by the sputtering is not limited especially, but it is preferable, for example to be 50° C. to 300° C. When the film formation temperature is less than 50° C., there is a risk that the obtained oxide film will include moisture by condensation. On the other hand, when the film formation temperature is more than 300° C., there is a risk that the substrate will be deformed, and that the oxide film will be cracked as the stress remains.

A pressure in a chamber at the time of sputtering is not limited especially, but it is preferable to perform by evacuating, for example to the extent of $5*10^{-5}$ Pa. Also, when using the sputtering target with diameter of 152.4 mm (6 inch), the power output to be supplied at the time of sputtering will be normally 10 W to 1000 W, and preferably 300 W to 600 W.

As a carrier gas at the time of sputtering, for example a gas of oxygen ($O_2$), helium (He), argon (Ar), xenon (Xe), Krypton (Kr) and else can be cited, and it is preferable to use a mixed gas of argon and oxygen. When using the mixed gas of argon and oxygen, a flow ratio of argon and oxygen will be normally Ar:$O_2$=100:0 to 80:20, and preferably Ar:$O_2$=100:0 to 90:10.

As mentioned above, the above mentioned characteristic oxide sintered body is used as the sputtering target for forming the oxide film, and the composition of its oxide sintered body will be reflected to the oxide film, so it will be an optically useful intermediate refractive index film with refractive index of 1.70 to 1.90, and also, composed of the oxide including In and Si, and trivalent or higher-valent metal element other than In and Si according to need.

Also, it is possible to obtain the oxide film with significant discharge stability by preventing the occurrence of arcing at the time of sputtering, as the above oxide sintered body is used as the sputtering target for forming the oxide film.

4. EXAMPLES

The present invention is further explained in detail according to the examples of the present invention and the comparative examples indicated below, but the present invention will not be limited by these examples and comparative examples.

Example 1

<Manufacturing of Oxide Sintered Body>

In example 1, non-crystalline $SiO_2$ powder and $In_2O_3$ powder with median diameter equal to or less than 1.0 μm were used as raw material powder, and they were mixed in the proportion that Si/In atomic ratio becomes 1.0, and pure water was mixed to be 40 mass %, polyvinyl alcohol as organic binder was mixed to be 2 mass %, and acrylate metacrylate copolymer ammonia neutralizer as dispersing agent was mixed to be 1.5 mass %, such that the raw material powder concentration becomes 65 mass %, and also, slurry was manufactured in a mixture tank.

Next, in the example 1, wet pulverization was performed until the median diameter of raw material powder becomes 0.7 mm by using a beads mill device (LMZ type, made by Ashizawa Finetech Ltd.) supplied with hard $ZrO_2$ ball with particle size 0.5 mm. In addition, for the measurement of the median diameter of raw material powder, a laser diffraction type particle size distribution measurement device (SALD-2200, made by Shimadzu Corporation) was used.

Then, in the example 1, the slurry obtained by mixing and stirring each raw material for 30 minutes or more was sprayed and dried by a spray drier device (ODL-20 type, made by Ohkawara Kakohki Co., Ltd.), and granulated powder was obtained.

Next, in the example 1, the granulated powder was formed by applying the pressure of 294 MPa (3.0 ton/cm$^2$) by cold isostatic press, and obtained formed body of about 200 mm φ was calcined for 20 hours in an atmospheric pressure furnace laid with planking made of zirconia at calcining temperature 1300° C., and an oxide sintered body was obtained.

In the example 1, the obtained oxide sintered body was worked so that the diameter becomes 152.4 mm (6 inch) and the thickness becomes 5 mm. Also, 20 oxide sintered bodies were manufactured, but there was no occurrence of cracking at the time of sintering and working in any of them.

Then, in the example 1, the obtained oxide sintered body was pulverized, and by performing a powder X-ray diffraction measurement using CuK α, thortveitite-type $In_2Si_2O_7$ phase and $In_2O_3$ phase were detected. However, a peak of crystalline $SiO_2$ compound phase single body or Si phase was not detected. The weight proportion of each compound phase was analyzed by Rietveld analysis, and the proportion of $In_2Si_2O_7$ phase was 15.2 mass %, and the proportion of $In_2O_3$ phase was 84.8 mass %.

Also, in the example 1, the contained Si/In atomic ratio was calculated from a result of performing quantitative analysis of the obtained oxide sintered body by ICP (Inductively Coupled Plasma) emission spectral analysis (SPS4000, made by Seiko Instruments Inc.), and it was 1.0 as same as the supplied composition.

In the example 1, the proportion of each compound phase considering the amount of non-crystalline $SiO_2$ was calculated from a result of Rietveld analysis and a result of quantitative analysis, and its mass ratio was such that $In_2Si_2O_7$ phase was 11.1 mass %, $In_2O_3$ phase was 62.0 mass %, and non-crystalline $SiO_2$ phase was 26.8 mass %.

Next, in the example 1, the density of the oxide sintered body was measured by Archimedes method, and the relative density with respect to a theoretical density 4.34 g/cm$^3$ (A) calculated from the density of thortveitite-type $In_2Si_2O_7$ crystal, which was 5.05 g/cm$^3$, the density of bixbyte-type $In_2O_3$ crystal, which was 7.18 g/cm$^3$, and the density of non-crystalline $SiO_2$, which was 2.2 g/cm$^3$, and from the abundance ratio of each phase, was calculated, and it was 99.8% (=(B/A)*100[%]).

Further, in the example 1, the test piece was manufactured from the oxide sintered body. And the test piece was worked to a stick shape by a process according to JIS R1601, and three-point bending test was performed. As a result, the calculated bending strength was 98.6 N/mm$^2$.

<Manufacturing of Oxide Film>

In the example 1, the oxide sintered body was worked so that the diameter becomes 152.4 mm (6 inch) and the thickness becomes 5 mm, and a sputtering target was obtained by bonding it to a backing plate made of oxygen-free copper by using metal indium.

Next, in the example 1, a film formation by DC sputtering was performed using the sputtering target. The obtained sputtering target was mounted to a cathode for non-magnetic material target of magnetron sputtering apparatus (SBH-2206, made by ULVAC, Inc.), on the other hand, non-alkaline glass substrate (coning #7059, thickness (t):1.1 mm) was used as the substrate for the film formation, and the distance between the target and the substrate was fixed at 60 mm.

In the example 1, after evacuated to be 5*10$^{-5}$ Pa or below, pure Ar gas and pure Ar+O$_2$ gas were introduced so that the concentration of O$_2$ becomes 0.4%, and gas pressure was adjusted to 0.6 Pa, and pre-sputtering was performed by applying direct current power of 300 W.

In the example 1, after performing sufficient pre-sputtering, the glass substrate was located still and right over the center (non-erosion part) of the sputtering target, and the oxide film with film thickness 200 nm was formed by performing the sputtering without heat.

As a result, in the example 1, there was no occurrence of cracking in the sputtering target, and there was no occurrence of significant roughness of target surface or abnormal discharge during 10 minutes from the initial film formation. Also, the refractive index of the obtained oxide film was measured by ellipsometer, and it was 1.79.

In the example 1, the manufacturing condition and characteristics of the oxide sintered body obtained by the example 1, and the film stability and physical property of the oxide film are indicated together in table 1. Also, each result in the following examples 2 to 7 and comparative examples 1 to 6 are also indicated in the table 1 as well as the example 1.

Example 2

<Manufacturing of Oxide Sintered Body>

In the example 2, the oxide sintered body was manufactured as well as the example 1, except that Si/In atomic ratio was adjusted to be 0.65, and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the example 2, as indicated in the table 1, the proportion of In$_2$Si$_2$O$_7$ phase was 30 mass % or less, and Si phase was not detected, and it satisfied the desired relative density and bending strength. Also, 20 oxide sintered bodies were manufactured and worked as well as the example 1, but there was no occurrence of cracking at the time of sintering and working in these oxide sintered bodies.

<Manufacturing of Oxide Film>

Then, in the example 2, the sputtering target was manufactured by bonding the oxide sintered body to the backing plate made of oxygen-free copper by using metal In, as well as the example 1. And, the oxide film was formed using this sputtering target.

As a result, in the example 2, as indicated in the table 1, there was no occurrence of cracking in the sputtering target, and there was no occurrence of significant roughness of target surface or abnormal discharge during 10 minutes from the initial film formation. Also, the refractive index of the obtained oxide film was 1.88.

Example 3

<Manufacturing of Oxide Sintered Body>

In example 3, the oxide sintered body was manufactured as well as the example 1, except that Si/In atomic ratio was adjusted to be 1.75, and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the example 3, as indicated in the table 1, the proportion of In$_2$Si$_2$O$_7$ phase was 30 mass % or less, and Si phase was not detected, and it satisfied the desired relative density and bending strength. Also, 20 oxide sintered bodies were manufactured and worked as well as the example 1, but there was no occurrence of cracking at the time of sintering and working in these oxide sintered bodies.

<Manufacturing of Oxide Film>

Then, in the example 3, the sputtering target was manufactured by bonding the oxide sintered body to the backing plate made of oxygen-free copper by using metal In, as well as the example 1. And, the oxide film was formed using this sputtering target.

As a result, in the example 3, as indicated in the table 1, there was no occurrence of cracking in the sputtering target, and there was no occurrence of significant roughness of target surface or abnormal discharge during 10 minutes from the initial film formation. Also, the refractive index of the obtained oxide film was 1.73.

Example 4

<Manufacturing of Oxide Sintered Body>

In the example 4, the oxide sintered body was manufactured as well as the example 1, except that the calcining temperature was adjusted to 1150° C., and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the example 4, as indicated in the table 1, Si phase was not detected, and it satisfied the desired relative density and bending strength. Also, 20 oxide sintered bodies were manufactured and worked as well as the example 1, but there was no occurrence of cracking at the time of sintering and working in these oxide sintered bodies.

<Manufacturing of Oxide Film>

Then, in the example 4, the sputtering target was manufactured by bonding the oxide sintered body to the backing plate made of oxygen-free copper by using metal In, as well as the example 1. And, the oxide film was formed using this sputtering target.

As a result, in the example 4, as indicated in the table 1, there was no occurrence of cracking in the sputtering target, and there was no occurrence of significant roughness of target surface or abnormal discharge during 10 minutes from the initial film formation. Also, the refractive index of the obtained oxide film was 1.78.

Example 5

<Manufacturing of Oxide Sintered Body>

In the example 5, the oxide sintered body was manufactured as well as the example 1, except that the calcining temperature was adjusted to 1350° C., and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the example 5, as indicated in the table 1, the proportion of $In_2Si_2O_7$ phase was 30 mass % or less, and Si phase was not detected, and it satisfied the desired relative density and bending strength. Also, 20 oxide sintered bodies were manufactured and worked as well as the example 1, but there was no occurrence of cracking at the time of sintering and working in these oxide sintered bodies.

<Manufacturing of Oxide Film>

Then, in the example 5, the sputtering target was manufactured by bonding the oxide sintered body to the backing plate made of oxygen-free copper by using metal In, as well as the example 1. And, the oxide film was formed using this sputtering target.

As a result, in the example 5, as indicated in the table 1, there was no occurrence of cracking in the sputtering target, and there was no occurrence of significant roughness of target surface or abnormal discharge during 10 minutes from the initial film formation. Also, the refractive index of the obtained oxide film was 1.80.

Example 6

<Manufacturing of Oxide Sintered Body>

In the example 6, the oxide sintered body was manufactured as well as the example 1, except that $TiO_2$ powder with median diameter equal to or less than 1.0 μm and including Ti was used, in addition to $In_2O_3$ powder and non-crystalline $SiO_2$ powder, and that Ti/In atomic ratio was adjusted to be 0.03 respectively, and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the example 6, as indicated in the table 1, the proportion of $In_2Si_2O_7$ phase was 30 mass % or less, and Si phase was not detected, and it satisfied the desired relative density and bending strength. Also, 20 oxide sintered bodies were manufactured and worked as well as the example 1, but there was no occurrence of cracking at the time of sintering and working in these oxide sintered bodies.

<Manufacturing of Oxide Film>

Then, in the example 6, the sputtering target was manufactured by bonding the oxide sintered body to the backing plate made of oxygen-free copper by using metal In, as well as the example 1. And, the oxide film was formed using this sputtering target.

As a result, in the example 6, as indicated in the table 1, there was no occurrence of cracking in the sputtering target, and there was no occurrence of significant roughness of target surface or abnormal discharge during 10 minutes from the initial film formation. Also, the refractive index of the obtained oxide film was 1.85.

Example 7

<Manufacturing of Oxide Sintered Body>

In the example 7, the oxide sintered body was manufactured as well as the example 1, except that $SnO_2$ powder with median diameter equal to or less than 1.0 μm and including Sn was used, in addition to $In_2O_3$ powder and non-crystalline $SiO_2$ powder, and that Sn/In atomic ratio was adjusted to be 0.02 respectively, and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the example 7, as indicated in the table 1, the proportion of $In_2Si_2O_7$ phase was 30 mass % or less, and Si phase was not detected, and it satisfied the desired relative density and bending strength. Also, 20 oxide sintered bodies were manufactured and worked as well as the example 1, but there was no occurrence of cracking at the time of sintering and working in these oxide sintered bodies.

<Manufacturing of Oxide Film>

Then, in the example 7, the sputtering target was manufactured by bonding the oxide sintered body to the backing plate made of oxygen-free copper by using metal In, as well as the example 1. And, the oxide film was formed using this sputtering target.

As a result, in the example 7, as indicated in the table 1, there was no occurrence of cracking in the sputtering target, and there was no occurrence of significant roughness of target surface or abnormal discharge during 10 minutes from the initial film formation. Also, the refractive index of the obtained oxide film was 1.81.

Comparative Example 1

<Manufacturing of Oxide Sintered Body>

In the comparative example 1, the oxide sintered body was manufactured as well as the example 1, except that Si/In atomic ratio was adjusted to be 0.5, and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the comparative example 1, as indicated in the table 1, the proportion of $In_2Si_2O_7$ phase was 30 mass % or less, and Si phase was not detected, and it satisfied the desired relative density and bending strength. Also, 20 oxide sintered bodies were manufactured and worked as well as the example 1, but there was no occurrence of cracking at the time of sintering and working in these oxide sintered bodies.

<Manufacturing of Oxide Film>

Then, in the comparative example 1, the sputtering target was manufactured by bonding the oxide sintered body to the backing plate made of oxygen-free copper by using metal In, as well as the example 1. And, the oxide film was formed using this sputtering target.

As a result, in the comparative example 1, as indicated in the table 1, there was no occurrence of cracking in the sputtering target, and there was no occurrence of significant roughness of target surface or abnormal discharge during 10 minutes from the initial film formation. However, the refractive index of the obtained oxide film was 1.94. In the comparative example 1, the oxide film having the desired refractive index of 1.70 to 1.90 was not obtained.

Comparative Example 2

<Manufacturing of Oxide Sintered Body>

In the comparative example 2, the oxide sintered body was manufactured as well as the example 1, except that Si/In atomic ratio was adjusted to be 2.0, and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the comparative example 2, as indicated in the table 1, Si phase was not detected, and it satisfied the desired relative density and bending strength. Also, 20 oxide sintered bodies were manufactured and worked as well as the example 1, but there was no occurrence of cracking at the time of sintering and working in these oxide sintered bodies. However, the proportion of $In_2Si_2O_7$ phase was 30 mass % or more.

<Manufacturing of Oxide Film>

Then, in the comparative example 2, the sputtering target was manufactured by bonding the oxide sintered body to the backing plate made of oxygen-free copper by using metal In, as well as the example 1. And, the oxide film was formed using this sputtering target.

As a result, in the comparative example 2, as indicated in the table 1, there was no occurrence of cracking in the sputtering target, and there was no occurrence of significant roughness of target surface or abnormal discharge during 10 minutes from the initial film formation. However, the refractive index of the obtained oxide film was 1.65. In the comparative example 2, the oxide film having the desired refractive index of 1.70 to 1.90 was not obtained.

Comparative Example 3

<Manufacturing of Oxide Sintered Body>

In the comparative example 3, the oxide sintered body was manufactured as well as the example 1, except that the calcining temperature was adjusted to 1000° C., and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the comparative example 3, as indicated in the table 1, $In_2Si_2O_7$ phase and Si phase were not detected. However, the relative density was 70.4% and the bending strength was 19.3 N/mm$^2$, so it did not satisfy the desired relative density and bending strength. Also, 20 oxide sintered bodies were manufactured and worked as well as the example 1, but the cracking occurred at the time of sintering and working in 15 of these oxide sintered bodies.

<Manufacturing of Oxide Film>

Then, in the comparative example 3, the sputtering target was manufactured by bonding the oxide sintered body to the backing plate made of oxygen-free copper by using metal In, as well as the example 1. And, the oxide film was formed using this sputtering target.

As a result, in the comparative example 3, as indicated in the table 1, there was no occurrence of significant roughness of target surface during 10 minutes from the initial film formation, and the refractive index of the obtained oxide film was 1.78.

However, in the comparative example 3, the abnormal discharge at the time of film formation occurred, and the cracking occurred to the target after film formation.

Comparative Example 4

<Manufacturing of Oxide Sintered Body>

In the comparative example 4, the oxide sintered body was manufactured as well as the example 1, except that the calcining temperature was adjusted to 1500° C., and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the comparative example 4, as indicated in the table 1, Si phase was not detected and the relative density was 90% or more. However, the proportion of $In_2Si_2O_7$ phase was 95.8 mass %, and it did not satisfy the desired bending strength. Also, 20 oxide sintered bodies were manufactured and worked as well as the example 1, but the cracking occurred at the time of sintering and working in 6 of these oxide sintered bodies.

<Manufacturing of Oxide Film>

Then, in the comparative example 4, the sputtering target was manufactured by bonding the oxide sintered body to the backing plate made of oxygen-free copper by using metal In, as well as the example 1. And, the oxide film was formed using this sputtering target.

As a result, in the comparative example 4, as indicated in the table 1, there was no occurrence of significant roughness of target surface during 10 minutes from the initial film formation, and the refractive index of the obtained oxide film was 1.77.

However, in the comparative example 4, the abnormal discharge at the time of film formation occurred, and the cracking occurred to the target after film formation.

Comparative Example 5

<Manufacturing of Oxide Sintered Body>

In the comparative example 5, the oxide sintered body was manufactured as well as the example 1, except that crystalline $SiO_2$ powder was used as $SiO_2$ raw material, and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the comparative example 5, as indicated in the table 1, Si phase was not detected and the proportion of $In_2Si_2O_7$ phase was 30 mass % or less. However, the relative density was 76.4% and the bending strength was 45.9 N/mm$^2$, so it did not satisfy the desired values. Also, 20 oxide sintered bodies were manufactured and worked as well as the example 1, but the cracking occurred at the time of sintering and working in 8 of these oxide sintered bodies.

<Manufacturing of Oxide Film>

Then, in the comparative example 5, the sputtering target was manufactured by bonding the oxide sintered body to the backing plate made of oxygen-free copper by using metal In, as well as the example 1. And, the oxide film was formed using this sputtering target.

As a result, in the comparative example 5, as indicated in the table 1, there was no occurrence of significant roughness of target surface during 10 minutes from the initial film formation, and the refractive index of the obtained oxide film was 1.80.

However, in the comparative example 5, the abnormal discharge at the time of film formation occurred, and the cracking occurred to the target after film formation.

Comparative Example 6

<Manufacturing of Oxide Sintered Body>

In the comparative example 6, the oxide sintered body was manufactured as well as the example 1, except that the oxide sintered body was manufactured by mixing $In_2O_3$ powder with median diameter equal to or less than 1.0 μm and metal Si powder with median diameter 5 μm by three-dimensional mixer, and then, by supplying the obtained mixed powder in a container made of carbon, and by performing hot press with the condition of the pressure at 4.9 MPa and the calcining temperature at 900° C., and the density of the oxide sintered body, the abundance ratio of each compound phase, the existence of Si phase, and the bending strength were measured respectively. Also, the relative density was calculated from the measured density of the oxide sintered body and the measured abundance ratio of each compound phase.

As a result, in the comparative example 6, as indicated in the table 1, the relative density of the obtained oxide sintered body was 90% or more, but the proportion of $In_2Si_2O_7$ phase was over 30 mass %, and Si phase was detected, and the bending strength was below 90 N/mm². Also, 20 oxide sintered bodies were manufactured and worked as well as the example 1, but the cracking occurred in 5 of these oxide sintered bodies.

<Manufacturing of Oxide Film>

Then, in the comparative example 6, the sputtering target was manufactured by bonding the oxide sintered body to the backing plate made of oxygen-free copper by using metal In, as well as the example 1. And, the oxide film was formed using this sputtering target.

As a result, in the comparative example 6, as indicated in the table 1, the significant roughness of target surface and the abnormal discharge occurred frequently, so the film formation was stopped, and the cracking occurred to the target after film formation. As mentioned above, the oxide sintered body obtained by the comparative example 6 was difficult to discharge stably at the time of film formation.

TABLE 1

| | | | | Manufacturing Condition of Sintered Body | | | | |
|---|---|---|---|---|---|---|---|---|
| | | Third | | | Raw Material Powder | Cal-cining | Sintered Body | |
| | Si/In | Component M | M/In | Si Raw Material | Pulver-ization Device | Temper-ature (° C.) | Relative Density (%) | Bending Strength (N/mm²) |
| Example 1 | 1.0 | — | — | Non-Crystalline $SiO_2$ | Beads Mill | 1300 | 99.8 | 98.6 |
| Example 2 | 0.65 | — | — | Non-Crystalline $SiO_2$ | Beads Mill | 1300 | 99.3 | 100.3 |
| Example 3 | 1.75 | — | — | Non-Crystalline $SiO_2$ | Beads Mill | 1300 | 99.6 | 93.5 |
| Example 4 | 1.0 | — | — | Non-Crystalline $SiO_2$ | Beads Mill | 1150 | 95.8 | 92.5 |
| Example 5 | 1.0 | — | — | Non-Crystalline $SiO_2$ | Beads Mill | 1350 | 97.7 | 96.1 |
| Example 6 | 1.0 | Ti | 0.03 | Non-Crystalline $SiO_2$ | Beads Mill | 1300 | 99.4 | 99.5 |
| Example 7 | 1.0 | Sn | 0.02 | Non-Crystalline $SiO_2$ | Beads Mill | 1300 | 99.9 | 104.2 |
| Comparative Example 1 | 0.5 | — | — | Non-Crystalline $SiO_2$ | Beads Mill | 1300 | 99.1 | 108.1 |

TABLE 1-continued

| | | | | | | | | |
|---|---|---|---|---|---|---|---|---|
| Comparative Example 2 | 2.0 | — | — | Non-Crystalline $SiO_2$ | Beads Mill | 1300 | 99.1 | 99.0 |
| Comparative Example 3 | 1.0 | — | — | Non-Crystalline $SiO_2$ | Beads Mill | 1000 | 70.4 | 19.3 |
| Comparative Example 4 | 1.0 | — | — | Non-Crystalline $SiO_2$ | Beads Mill | 1500 | 99.2 | 47.8 |
| Comparative Example 5 | 1.0 | — | — | Crystalline $SiO_2$ | Beads Mill | 1300 | 76.4 | 45.9 |
| Comparative Example 6 | 1.0 | — | — | Si | — | 900 | 90.8 | 71.6 |

| | Sintered Body | | | | | Film Formation | | | |
|---|---|---|---|---|---|---|---|---|---|
| | Calculated True Density (g/cm³) | Proportion of $In_2SiO_7$ Phase (mass %) | Proportion of $In_2O_3$ Phase (mass %) | Proportion of $SiO_2$ Phase (mass %) | Si Phase | Cracking of sintered body when manufacturing target | Roughness of target surface when forming film | Abnormal discharge when forming film | Cracking of sintered body when forming film | Transparent Conductive Film Refractive Index |
| Example 1 | 4.34 | 15.2 | 84.8 | — | No | No | No | No | No | 1.79 |
| Example 2 | 4.86 | 8.8 | 91.2 | — | No | No | No | No | No | 1.88 |
| Example 3 | 3.71 | 25.9 | 74.1 | — | No | No | No | No | No | 1.73 |
| Example 4 | 4.26 | — | 100 | — | No | No | No | No | No | 1.78 |
| Example 5 | 4.38 | 22.3 | 77.7 | — | No | No | No | No | No | 1.80 |
| Example 6 | 4.33 | 13.8 | 86.2 | — | No | No | No | No | No | 1.85 |
| Example 7 | 4.35 | 17.5 | 82.5 | — | No | No | No | No | No | 1.81 |
| Comparative Example 1 | 5.17 | 6.0 | 94.0 | — | No | No | No | No | No | 1.94 |
| Comparative Example 2 | 3.59 | 30.8 | 69.2 | — | No | No | No | No | No | 1.65 |
| Comparative Example 3 | 4.26 | — | 100 | — | No | Yes (15) | No | Yes | Yes | 1.78 |
| Comparative Example 4 | 5.02 | 95.8 | 2.9 | 1.3 | No | Yes (6) | No | Yes | Yes | 1.77 |
| Comparative Example 5 | 4.45 | 9.0 | 63.6 | 27.4 | No | Yes (8) | No | Yes | Yes | 1.80 |
| Comparative Example 6 | 5.17 | 92.1 | 7.9 | — | Yes | Yes (5) | Yes | Yes | Yes | — |

As mentioned above, and as indicated in the table 1, the examples 1 to 5 comprise In and Si, and non-crystalline $SiO_2$ powder was used as raw material of Si, and the granulated powder was obtained by weighing and mixing each raw material powder in a proportion that Si content becomes 0.65 to 1.75 in Si/In atomic ratio, and each oxide sintered body was obtained without damage by sintering the formed body obtained by pressure forming this granulated powder at calcining temperature 1100° C. to 1400° C. by normal pressure sintering process.

As a result, it was confirmed that the oxide sintered body obtained by the examples 1 to 5 was useful as the sputtering target for stably obtaining the intermediate refractive index film with the refractive index of 1.70 to 1.90.

Also, in the examples 6 and 7, as indicated in the table 1, $TiO_2$ and $SnO_2$ were further used as oxide powder including trivalent or higher-valent metal element other than In and Si, in addition to non-crystalline $SiO_2$ powder, and the granulated powder was obtained by weighing and mixing each raw material powder in a proportion that the content of Ti and Sn becomes 0.001 to 0.05 in Ti/In and Sn/In atomic ratio, and each oxide sintered body was obtained without damage by sintering the formed body obtained by pressure forming this granulated powder at calcining temperature 1200° C. to 1400° C. by normal pressure sintering process.

As a result, it was confirmed that the oxide sintered body obtained by the examples 6 and 7 was useful as the sputtering target for stably obtaining the intermediate refractive index film with the refractive index of 1.70 to 1.90.

On the other hand, in the comparative examples 1 to 6, as indicated in the table 1, each oxide sintered body was obtained by manufacturing them by the process different from the example 1 in any of the conditions of Si/In atomic ratio, calcining temperature, raw material of Si and pulverization device, compared to the manufacturing process of the oxide sintered body obtained by the example 1.

As a result, it was understood that the oxide sintered body obtained by the comparative examples 1 to 6 cannot be used as the sputtering target, as the intermediate refractive index film with the refractive index of 1.70 to 1.90 was not obtained stably, and also, as the mechanical strength was deteriorating in some of each oxide sintered body.

The invention claimed is:

1. An In—Si—O based oxide sintered body comprising In and Si as main components without Zr, Hf, and Zn,
    wherein
        an atomic ratio of Si to In (Si/In) is 0.65 to 1.75,
        a relative density calculated by an actual measured value of density of the oxide sintered body with respect to a density calculated from true density and abundance ratio of each compound phase composing the oxide sintered body is 90% or more, and
        a bending strength is 90 N/mm$^2$ or more.

2. The oxide sintered body as claimed in claim 1, wherein a proportion of a crystalline phase of thortveitite-type indium silicate compound is 30 mass % or less.

3. The oxide sintered body as claimed in claim 1, wherein it does not comprise a metal Si phase.

4. The oxide sintered body as claimed in claim 3, wherein the metal Si phase will not be detected by a X-ray diffraction method of powder of the oxide sintered body and/or an electron ray diffraction method of lamina of the oxide sintered body.

5. The oxide sintered body as claimed in claim 1, wherein it does not comprise a crystalline silicon dioxide compound phase.

6. The oxide sintered body as claimed in claim 5, wherein the crystalline silicon dioxide compound phase will not be detected by a X-ray diffraction method of powder of the oxide sintered body and/or an electron ray diffraction method of lamina of the oxide sintered body.

7. The oxide sintered body as claimed in claim 1, further comprising at least one metal element (M) other than In and Si that has a valency of 3 or more, wherein an atomic ratio of the at least one metal element (M) to In (M/In) is 0.001 to 0.05.

8. A process of manufacturing the oxide sintered body as claimed in claim 1, comprising sintering a body formed from raw material powders at normal atmospheric pressure, wherein the raw material powders comprise indium oxide powder as a raw material of In and non-crystalline silicon dioxide powder as a raw material of Si respectively.

9. The process as claimed in claim 8, wherein the formed body is sintered at a temperature in a range of from 1100° C. to 1400° C.

10. An oxide film obtained by a sputtering process in which the oxide sintered body as claimed in claim 1 is a sputtering target, wherein the oxide film has a refractive index in a range of from 1.70 to 1.90.

11. An In—Si—O based oxide sintered body comprising In and Si as the only main components,
    wherein
        an atomic ratio of Si to In (Si/In) is 0.65 to 1.75,
        a relative density calculated by an actual measured value of density of the oxide sintered body with respect to a density calculated from true density and abundance ratio of each compound phase composing the oxide sintered body is 90% or more, and
        a bending strength is 90 N/mm$^2$ or more.

* * * * *